United States Patent

Ohtsukasa et al.

Patent Number: 6,077,347
Date of Patent: Jun. 20, 2000

[54] SINGLE CRYSTAL PULLING APPARATUS AND DROPPAGE PREVENTING DEVICE

[75] Inventors: Naritoshi Ohtsukasa, Isehara; Hiroshi Yoshinada, Machida; Kazuhiro Mimura, Hiratsuka, all of Japan

[73] Assignee: Komatsu Electronic Metals Co., Ltd., Kanagawa, Japan

[21] Appl. No.: 09/221,514

[22] Filed: Dec. 28, 1998

[30] Foreign Application Priority Data

Jan. 7, 1998 [JP] Japan .................................. 10-001679

[51] Int. Cl.$^7$ .................................................. C30B 35/00
[52] U.S. Cl. ............................ 117/200; 117/208; 117/218
[58] Field of Search ................................... 117/200, 208, 117/223, 218

[56] References Cited

U.S. PATENT DOCUMENTS

| | | | |
|---|---|---|---|
| 5,126,113 | 6/1992 | Yamagishi et al. | 422/249 |
| 5,843,229 | 12/1998 | Kimura et al. | 117/218 |
| 5,879,448 | 3/1999 | Urano et al. | 117/13 |
| 5,882,397 | 3/1999 | Iino et al. | 117/13 |
| 5,885,347 | 3/1999 | Tomioka et al. | 117/218 |
| 5,911,821 | 6/1999 | Iino et al. | 117/13 |
| 5,935,329 | 8/1999 | Schulmann | 117/218 |
| 5,951,759 | 9/1999 | Inagaki et al. | 117/218 |

*Primary Examiner*—Benjamin L. Utech
*Assistant Examiner*—Matthew Anderson
*Attorney, Agent, or Firm*—Welsh & Katz, Ltd.

[57] ABSTRACT

A single crystal pulling apparatus and droppage preventing device constituted so as to enable the mechanical strength required by an arm to be decreased, and to enable arm manufacturing costs to be reduced and the pulling apparatus to be made more compact, and furthermore, to eliminate the need to provide in a separate manner a mechanism for preventing single crystal droppage, and to enhance reliability and durability by not adversely affecting a clean environment during single crystal growth. The arm has a mating member, which mates with the mating portion of a single crystal, and does not allow the single crystal to drop when pulling the single crystal. The arm undergoes an attitude change to a mating position in accordance with moving a circular motion having a circular motion support point as the center of the circular motion. And, when the single crystal mating portion is formed, the arm undergoes an attitude change, arriving at a position, at which the arm mating member is capable of mating with the mating portion of the single crystal. And then, when mated to the single crystal mating portion, the arm is raised in synch with the single crystal pulling operation. At this time, the arm is raised, maintaining a vertical attitude.

10 Claims, 6 Drawing Sheets

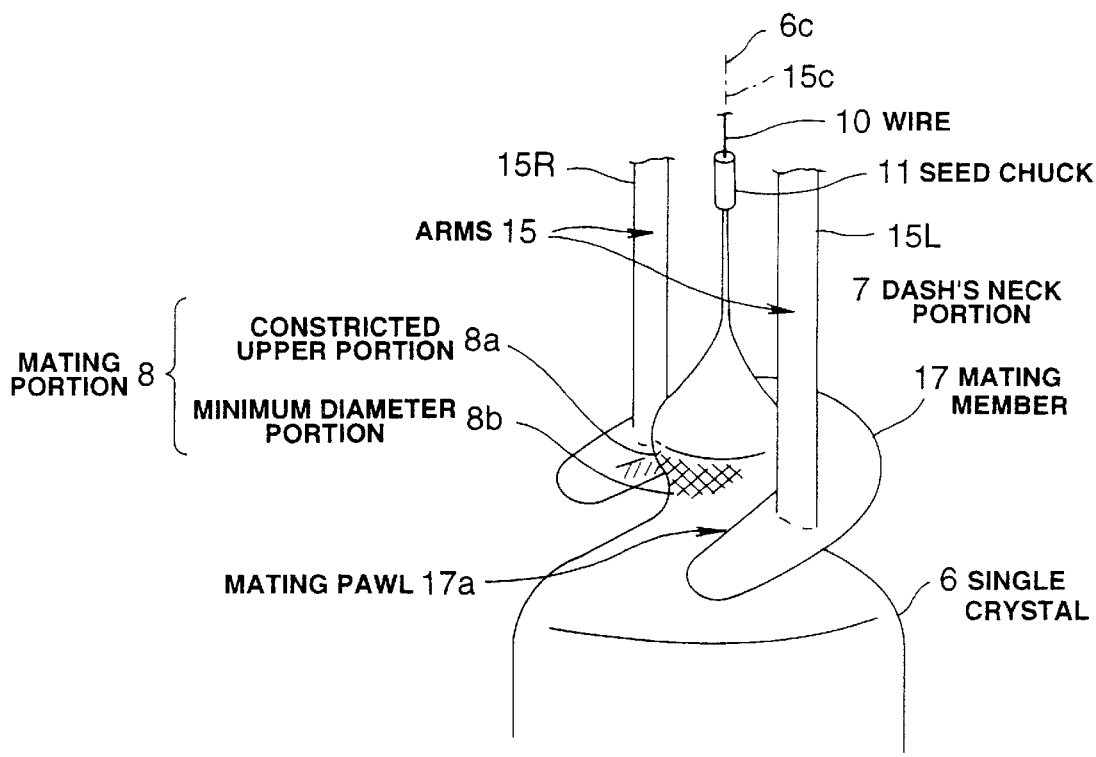
FIG.2
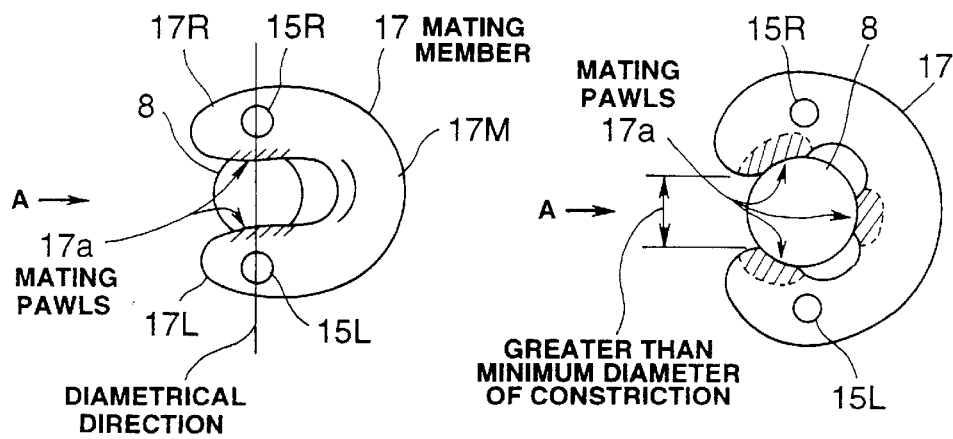
FIG.3(a) FIG.3(b)

SINGLE CRYSTAL PULLING APPARATUS AND DROPPAGE PREVENTING DEVICE

BACKGROUND OF THE INVENTION

1. Field of the Invention

The present invention relates to a single crystal pulling apparatus used when growing a single crystal in accordance with bringing a seed crystal in contact with a melt, and then pulling this seed crystal from the melt, and a droppage preventing device for preventing droppage when pulling a single crystal.

2. Description of the Related Art

In line with the progress of VLSI in recent years, there has arisen a need to lower costs during the VLSI fabrication. To realize this cost reduction, it is imperative that the diameter of the silicon wafer be made larger. In order to efficiently obtain large diameter wafers in large numbers, it has been learned that when pulling and growing a single crystal in accordance with the so-called Czochralski process (CZ process), the larger the crystal diameter, the longer the semiconductor silicon single crystal should be.

However, this is premised on the pulling and growing of a dislocation-free good quality single crystal.

For this reason, prior to enlarging the silicon single crystal from the seed crystal to the desired crystal diameter, ordinarily there is performed an operation called necking, by which the diameter of the crystal grown from the seed crystal is narrowed one time.

Accordingly, to realize a dislocation-free, there is an upper limit to the thickness of the necking, that is, the thickness of the Dash's neck portion, and, from the standpoint of tensile strength, this poses a problem in pulling a single crystal having a Dash's neck portion diameter of the thickness of the upper limit thereof.

In other words, when pulling a large diameter, heavy silicon single crystal, there is the concern that the Dash's neck portion (hereinafter called the neck portion for convenience sake), which has a thin diameter and insufficient mechanical strength, will break, making it impossible to achieve the anticipated goal of pulling and growing a single crystal.

Accordingly, to avoid this kind of situation, there has been proposed a method, which, as shown in FIG. 1, forms a nodule portion below the neck portion 7 of a single crystal 6, forms a neck-shaped mating portion 8, which has sufficient mechanical strength, and joins this mating portion 8 so as to mate with a mating member provided at the tip of an arm as this arm is pulled up.

In this case, at first, the arm mating member is at standby at a location separated from the surface of the melt inside the furnace, a seed crystal at the tip of a wire is brought in contact with the melt, a neck portion is formed, then, at the point in time when the mating portion is formed, the arm changes attitude so that the arm mating member mates with mating portion of the single crystal. After the single crystal is mated with the arm in this way, while the single crystal is being held by the arm, the arm is raised together with the above-mentioned wire, and the single crystal is pulled.

A device of this types was disclosed in Japanese Patent Application Laid-open No. 9-2893.

In this publicly-disclosed invention, a pair of mutually intersecting arms is used. The pair of arms are closed in accordance with an actuator, and the single crystal is sandwiched between and held by the mating pawls at the tips of the arms.

However, with this pair of intersecting arms, if force is not applied to the tips of the arms by an actuator, they are not able to sandwich and hold the single crystal.

That is, for example, if the operation of the actuator is canceled and the arms are raised, a bending moment acts on the arms in a direction that causes the arms to open. Consequently, the single crystal must be sandwiched and held in accordance with the mating pawls at the tips of the arms by applying via an actuator an opposite bending moment capable of overcoming this bending moment.

In this manner, the shape of a conventional arm constitutes a shape, by which the mating pawl of the arm is not maintained in an attitude that enables mating with the mating portion of the single crystal in accordance with the self-weight of the arm itself (if force is not applied by an actuator, the arm opens), and to raise the arms while maintaining as-is the mating state of the single crystal, a force for causing mating with the arms (a force for preventing the opening of the arms) must be transmitted at all times.

Therefore, in this manner, in line with the operation of the actuator, it is necessary to increase the mechanical strength of the arm in order to cope with the force applied to the arm, that is, the bending moment that acts on the arm, so that the arm member must be large and thick. Consequently, the arms weigh more, and also take up more space, and in addition to increasing arm manufacturing costs, give rise to the problem of having to make the pulling apparatus larger.

Further, because a device of the type that sandwiches and holds a single crystal with a pair of intersecting arms of this kind constitutes a structure which sandwiches and holds a single crystal from two sides, often times the arm tips open easily in line with the raising of the arms, and the single crystal separates from the mating pawls.

Accordingly, the invention publicly disclosed in Japanese Patent Application Laid-open No. 9-183694 is constituted so as to provide, separate from the mating pawls at the tips of the arms, an arm-latching mechanism to prevent the arm tips from opening. In other words, it is constituted so as to provide an arm-latching mechanism inside the furnace.

However, the inside of the furnace is hot, and in a near vacuum state, and providing a complex mechanism such as this arm-latching mechanism thereinside is problematic from the standpoints of the reliability and durability of the mechanism.

Moreover, since the inside of the furnace is the place where a single crystal is grown, the inside thereof must be maintained in an environmentally clean state.

Accordingly, providing a mechanism, such as the above-mentioned arm-latching mechanism, which raises concerns about the dust generated in line with operation means there are concerns that an environmentally clean state cannot be maintained.

As described above, a conventional single crystal-mating arm constitutes a shape, which is unable to maintain the single crystal mating state when the arm is being raised unless a force is constantly applied by an actuator.

Consequently, to cope with the bending moment, which acts on the arm in line with the operation of the actuator, it was necessary to enhance the mechanical strength of the arm, thus increasing arm manufacturing-related costs, and furthermore, increasing the size of the arm, making it impossible to make the pulling apparatus more compact.

Further, the mating pawl at the tip of a conventional arm constitutes a shape, which causes the single crystal to drop down (arm tip opens) when the arm is raised as-is.

Consequently, to prevent single crystal droppage (arm opening) when raising the arm, it was necessary to provide a separate arm opening preventing mechanism to prevent arm opening, and the dust generated in line with the operation of this arm opening preventing mechanism can have an adverse affect on the clean environment during single crystal growth. Further, since it is necessary to provide a complex mechanism inside the furnace, problems arise from the standpoints of reliability and durability as well.

SUMMARY OF THE INVENTION

The present invention is constituted with this situation in view, and solves for these problems by making it possible to reduce the mechanical strength required by an arm, and enabling arm manufacturing costs to be lowered, and the pulling apparatus to be made more compact, and furthermore, strives to solve the problem of increasing reliability and durability by eliminating the need for providing a separate mechanism for preventing single crystal droppage (arm opening), and not adversely affecting the clean environment when growing a single crystal.

Accordingly, a first invention of the present invention is a single crystal pulling apparatus, which is used when growing a single crystal in accordance with bringing a seed crystal in contact with a melt, and then pulling said seed crystal from said melt, wherein:

a mating portion is formed on said single crystal;

an arm of a shape is provided, whose center axis is positioned on a same axis as a vertical center axis of the single crystal when said single crystal is pulled, the arm having a mating member of a shape, which mates to said mating portion and which does not allow said single crystal to drop when said single crystal is pulled, the arm being provided with a circular motion support point at a predetermined location in a longitudinal direction of said arm, by which said arm is made to move in a circular manner until the mating member of the arm is in a position that enables mating with the mating portion of said single crystal; and an attitude of said arm is changed to the position at which the mating member of said arm is able to mate with the mating portion of said single crystal, and thereafter, the arm is raised in a state in which said mating member of the arm is made to mate with the mating portion of said single crystal.

That is, in accordance with a constitution such as this, as shown in FIG. 1, the invention has a mating member 17 of a shape, which, when mated to the mating portion 8 of a single crystal 6, does not allow the single crystal 6 to drop when the single crystal 6 is being pulled, and is provided with an arm 15 of a shape, by which the center axis 15c is positioned on the same axis as the vertical center axis 6c of a single crystal 6 when the single crystal 6 is being pulled. The arm 15 undergoes an attitude change to the mating position by being moved in a circular manner in the direction of arrow E2, having the circular motion support point 51a as the center of the circular motion.

And then, when a mating portion 8 is formed in the single crystal 6, the arm 15 undergoes an attitude change as indicated by arrow E2, and the mating member 17 of the arm 15 arrives at a position which enables mating with the mating portion 8 of the single crystal 6 (See FIG. 2). Then, in a state, wherein the mating member 17 of the arm 15 is mated to the mating portion 8 of the single crystal 6, this arm 15 is synchronized to the single crystal 6 pulling operation (a wind-up operation in accordance with wire 10), and raised in the direction of arrow J1. At this time, the arm 15 is raised with the attitude of the arm 15 maintained in the vertical attitude as-is (the attitude of the arm 15 does not change in a way that the single crystal 6 separates from the arm 15). More specifically, as shown in FIG. 2, since the center axis 15c of the arm 15 aligns with the vertical center axis 6c of the single crystal 6, the single crystal 6 is pulled in a state, wherein the center of gravity of the single crystal 6 is positioned on the center axis 15c of the arm 15.

In this manner, in the first invention, since the arm 15, which mates with the single crystal 6, constitutes a shape, by which the center axis is positioned on the same axis as the vertical center axis 6c of the single crystal 6 even when the arm 15 is being raised (even when a force in accordance with the single crystal 6 is acting on the arm 15), the arm 15 can be raised with the mating state of the single crystal 6 maintained as-is even without an actuator 14 applying the force required for mating.

Consequently, the force placed on the arm 15 when raising the arm 15 is only the pulling force, which corresponds to the weight of the single crystal 6, and the arm is not subjected to a huge bending moment. As a result thereof, in addition to being able to reduce the mechanical strength required by the arm, and to cut down on arm manufacturing-related costs, it also becomes possible to make the arm smaller and more lightweight, and to make the single crystal pulling apparatus more compact.

Further, since the mating member 17 of the arm 15 is made in a shape, which mates to the mating portion 8 of the single crystal 6, and which does not allow the single crystal 6 to drop when the single crystal is being pulled, there is no need to provide a separate arm opening preventing mechanism for preventing the opening of the arm 15 to prevent single crystal droppage (arm opening) when the arm is raised. That is, the no-movable-parts mating member 17 alone can securely mate with the single crystal 6, and is capable of preventing droppage during pulling.

In this manner, because it is not necessary to provide the mating member 17 with movable parts, dust is not generated at mating, making it possible to maintain a clean environment during single crystal growth. Further, since it is not necessary to provide a complex mechanism inside the furnace, reliability and durability can be improved.

Further, in a second invention, the single crystal pulling apparatus according to the first invention is constituted so that the attitude of said arm is changed to the position at which the mating member of said arm is able to mate with the mating portion of said single crystal, by actuating an actuator connected to said arm.

According to the second invention, the attitude of the arm 15 is changed to a mating position, as indicated by arrow E2, in accordance with the operation of an actuator 14.

Further, in a third invention, the single crystal pulling apparatus according to the first invention is constituted so that the attitude of said arm is changed to the position at which the mating member of said arm is able to mate with the mating portion of said single crystal, by a gravitational force acting on said arm.

According to the third invention, as shown in FIG. 8, the attitude of the arm 15 is changed to the mating position by the gravitational force acting on the arm 15, as indicated by the arrow E2.

Further, in a fourth invention, the single crystal pulling apparatus according to the first invention, the arm 15 is an integrally-formed arm.

Further, in a fifth invention, the single crystal pulling apparatus according to the first invention is constituted such that the arm is provided with the circular motion support point at the predetermined location in the longitudinal direction of said arm, by which said arm is made to move in the circular manner until the mating member of the arm is in the position that enables mating with the mating portion of said single crystal, the circular motion support point being raised in synch with the pulling operation of said single crystal.

According to the fifth invention, the attitude of the arm 15 is changed to the mating position by moving the arm 15 in a circular manner in the direction indicated by arrow E2, having the circular motion support point 15a as the center of circular motion. And then, the circular motion support point 15a is raised in synch with the single crystal 6 pulling operation in accordance with the wire 10 as indicated by arrow J1, and the single crystal 6 is pulled.

Further, in a sixth invention, the single crystal pulling apparatus according to the second invention is constituted so that the arm comprises upper and lower members, the upper arm member being connected to said actuator, the lower arm member having said mating member, and being suspended in a free-swinging manner relative to said upper arm member so as to be capable of maintaining a vertical attitude in accordance with self-weight in a state in which the lower arm member undergoes an attitude change to a position which enables mating with the mating portion of said single crystal.

According to the sixth invention, as shown in FIG. 8, since the lower arm member 15T is suspended from the upper arm member 15U in a free-swinging manner, the lower arm member 15T is capable of maintaining a vertical attitude by self-weight alone, without the need for the controlling force of an actuator.

Further, in a seventh invention, the single crystal pulling apparatus according to the first invention is constituted so that the mating member constitutes a shape, which mates by diametrically supporting the mating portion of said single crystal at two points.

According to the seventh invention, as shown in FIG. 3(a), the mating portion 8 of the single crystal 6 is diametrically supported at 2 points in accordance with the mating member 17. Consequently, at mating, even if there is a shift relative to the optimum mating position, the single crystal 6 is oscillated, having the axis that passes through the above-mentioned 2 mating points as the center of oscillation, and the shift thereof is corrected.

Further, in an eighth invention, the single crystal pulling apparatus according to the first invention is constituted so that the mating member constitutes a shape, which mates by supporting the mating portion of said single crystal at three or more points.

According to the eighth invention, as shown in FIG. 3(b), the mating portion 8 of the single crystal 6 is supported at 3 or more points in accordance with the mating member 17. Consequently, the single crystal 6 is securely mated in accordance with the mating member 17, and the attitude of the single crystal 6 is stable during single crystal pulling.

Further, in a ninth invention, the single crystal pulling apparatus according to the first invention is constituted so that the mating member mates with the mating portion of said single crystal by two opposing members, and wherein the mating member is provided a member which links these two opposing members so that a space between these two opposing members will not open when pulling said single crystal.

According to the ninth invention, as shown in FIG. 3(a), there is provided a member 17M, which links these 2 opposing members 17R, 17L, so that the space between the 2 opposing members 17R, 17L of the mating member 17 does not widen during single crystal 6 pulling. As in FIG. 3(a), the members 17R, 17L, 17M can be integrated, or, as shown in FIG. 10, can be constituted separately. In FIG. 10, the space between the arms 15R, 15L is linked in the vicinity of the mating member 17 in accordance with a linking member 17M. Further, as shown in FIG. 9(a), the root portion of the arm 15, which is distant from the mating member 17, can also serve as a linking member 17M. The opposing members 17R, 17L shown in FIG. 5(a) can be utilized as a separate-body mating member 17' in place of the mating member 17 in FIG. 9(a).

Consequently, the opening of opposing members 17R, 17L of the mating member 17 is prevented during single crystal 6 pulling, and the single crystal 6 is prevented from separating from the mating member 17.

Further, the above-mentioned first invention can be applied to a device for preventing droppage when a single crystal 6 is being pulled in accordance with a wire 10.

BRIEF DESCRIPTION OF THE DRAWINGS

FIG. 2 is an oblique view showing a state, wherein an arm is mated with a single crystal;

FIGS. 3(a) and 3(b) are cross-sectional views of portions, at which arm mating members mate;

DESCRIPTION OF THE PREFERRED EMBODIMENTS

Embodiments of an apparatus related to the present invention are described hereinbelow with reference to the figures.

Figure 1:
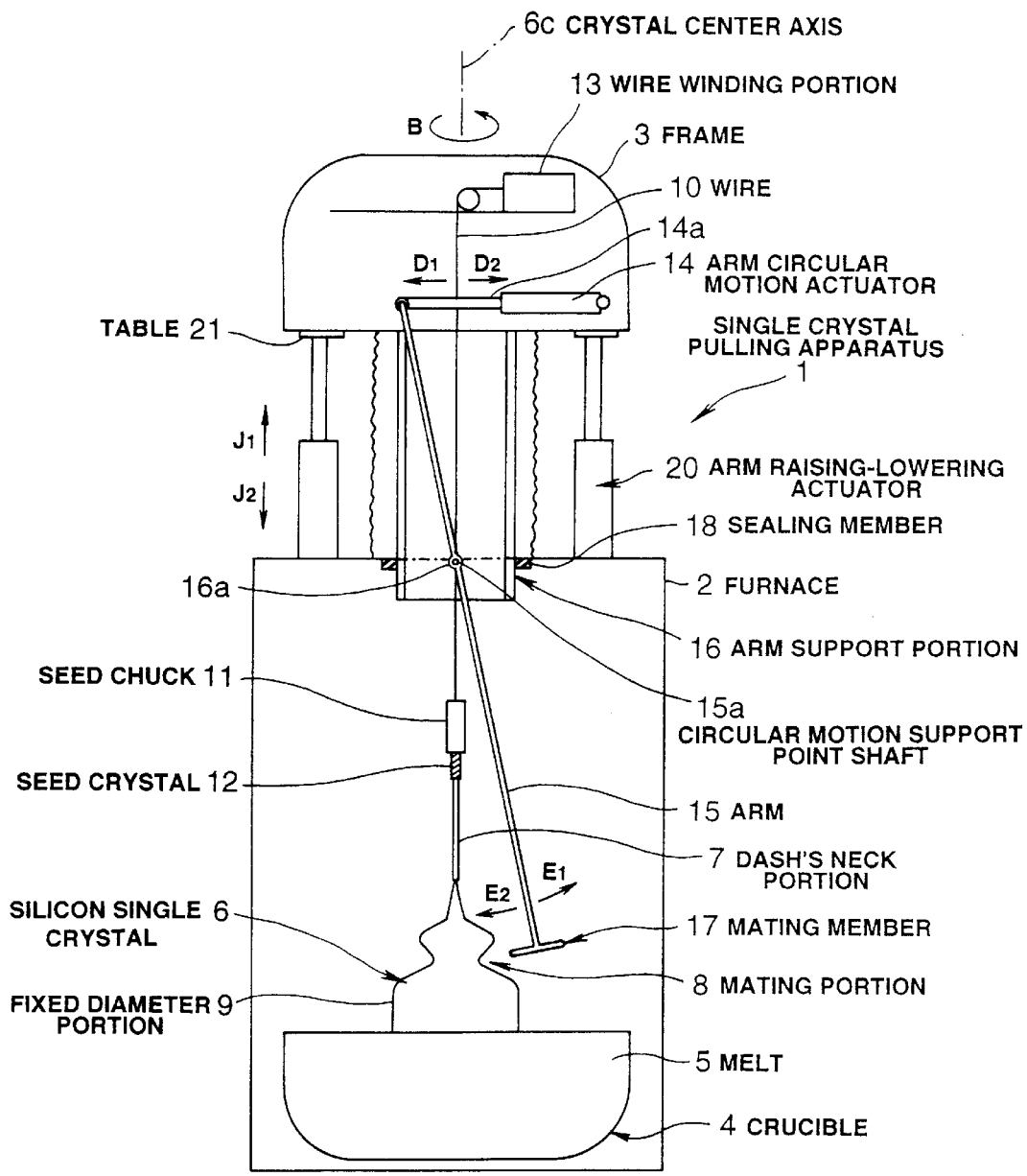
FIG. 1 is a diagram showing the constitution of a first embodiment of a single crystal pulling apparatus of the present invention.

FIG. 1 shows the constitution of a single crystal pulling apparatus 1 (single crystal growing apparatus) of this embodiment. Furthermore, in this embodiment, a single crystal is assumed to be a silicon (Si) single crystal.

FIG. 1 shows a first embodiment, in which an integrally-formed arm is used as the arm for pulling a single crystal.

As shown in FIG. 1, broadly speaking, the apparatus of this embodiment comprises a furnace 2, and a frame 3, the vertical position of which is able to change relative to this furnace 2.

A crucible 4, the inside of which is filled with a silicon melt 5, is provided inside the furnace 2. Furthermore, in the figure, a heater, which melts the silicon melt 5, and a mechanism, which rotates the crucible 4, have been omitted.

And the inside of the furnace 2 is evacuated to around several 10 s of torr, and is filled with an argon gas. In this manner, the inside of the furnace 2 constitutes a near vacuum, high temperature state.

A single crystal 6 is grown inside this furnace 2. The center axis 6c of this single crystal 6 (crystal center axis) corresponds to either the center axis of the furnace 2, or the center axis of the frame 3.

This single crystal 6 is pulled and grown in accordance with a wire 10 as a cable-shaped body. Furthermore, another cable-shaped body, for example, a chain or the like, can be used in place of this wire 10.

A wire winding portion 13, which winds the above-mentioned wire 10, is provided inside the frame 3.

Further, an actuator 14 for moving an arm in a circular motion in order to change the circular motion attitude of a hereinbelow-described arm 15, is provided inside the frame 3.

Figures 9A, 9B:
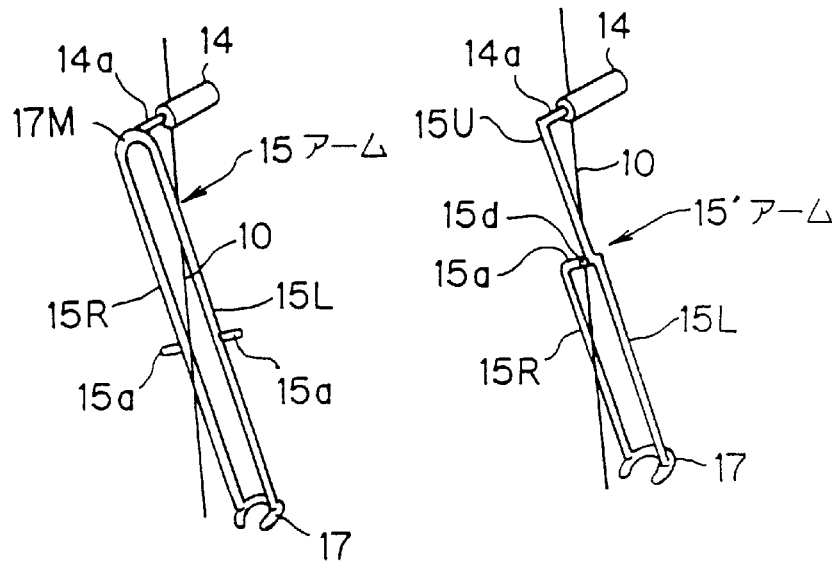
FIGS. 9(a) and 9(b) are diagrams showing examples of shapes of arms of the first embodiment.

FIG. 9(a) shows the overall shape of the arm 15.

As shown in this figure, a circular motion support point shaft 15a is provided at a predetermined location of the arm 15 in the longitudinal direction, and this circular motion support point shaft 15a passes through, in a manner that enables free circular motion, a shaft hole 16a provided in an arm support portion 16. That is, the arm 15 is supported so as to freely move in a circular manner around a circular motion support point 15a in accordance with an arm support portion 16.

This arm support portion 16 is connected to the frame 3, and is provided so as to move freely in the up-down direction (J1, J2 direction), or to revolve freely around the crystal center axis 6c (revolving direction B), relative to the furnace 2 via a sealing portion 18.

An arm raising-lowering actuator 20 is an actuator for raising in the J1 direction, or lowering in the J2 direction the arm 15, together with the above-mentioned arm support portion 16, and the tip of the rod thereof is connected to a table 21. The frame 3 is constituted so as to revolve relative to this table 21 around the crystal center axis 6c (revolving direction B) in accordance with a revolving mechanism not shown in the figure.

Therefore, when this revolving mechanism is operated, the arm support portion 16 revolves together with the frame.

Further, a seed chuck, which is a holding chuck for affixing and holding a seed crystal 12, is suspended from the end of the wire 10.

Next, the structure of the arm 15 is described in greater detail.

The structure of the arm 15 is described by also referencing FIG. 9(a), which shows the overall shape of the arm 15.

As shown in these figures, the upper end of the arm 15 is connected to the end of the rod 14a of the arm circular motion actuator 14, which is a direct-acting actuator.

And the bottom end of the arm 15 comprises a mating member 17, which is capable of mating with the mating portion 8 formed on the single crystal 6.

The arm 15 and mating member 17 can be formed in an integrated manner, or can be constituted by securing the mating member 17 and the long-shaped arm 15.

Thus, when the arm circular motion actuator 14 operates, and the rod 14a extends in the direction of arrow D1 (rod extending direction), the arm 15 moves in a circular motion around the circular motion support point 15a in the direction of arrow E1, undergoing an attitude change so as to separate from the mating portion 8 of the single crystal 6. Conversely, when the rod 14a retracts in the direction of arrow D2 (rod retracting direction), the arm 15 moves in a circular motion around the circular motion support point 15a in the direction of arrow E2, undergoing an attitude change to a position, which enables mating with the mating portion 8 of the single crystal 6.

Here, FIG. 2 shows the arm attitude of a state, wherein the arm circular motion actuator 14 is not operating, in other words, a state, wherein only gravitational force is acting on the arm 15.

That is, this arm 15 constitutes an attitude, which, in accordance with self-weight, positions the mating member 17 of the lower end of the arm 15 in a position, which enables mating with the mating portion 8 of a single crystal 6, and furthermore, constitutes a shape, which maintains this arm attitude as-is even when the arm 15 is raised.

More specifically, when gravitational force alone is acting on the arm 15, the vertical center axis 6c of a single crystal 6 corresponds to the vertical center axis 15c of the arm 15. In other words, the constitution is such that the center of gravity of a single crystal 6 is positioned on the center axis 15c of the arm 15.

Consequently, in a state, wherein the mating member 17 of the arm 15 mates with the mating portion 8 of a single crystal 6, .it becomes possible to stably pull a single crystal 6 with only downward force in the vertical direction acting on the arm 15 (no force acting in a direction that causes a single crystal 6 to separate from the mating member 17) even when the arm is raised in the vertical direction.

Further, the mating member 17, which comprises the lower end of the arm 15, is mated to the mating portion 8 of a single crystal, and constitutes a shape, which does not allow the single crystal 6 to fall when the single crystal 6 is pulled.

More specifically, as shown in FIG. 3(a), 2 mating pawls 17a are provided on the mating member 17, and in accordance with these 2 mating pawls 17a, the mating portion 8 of a single crystal 6 is diametrically supported at 2 points. Further, as shown in FIG. 3(b), 3 mating pawls 17a are provided on the mating member 17, and in accordance with these 3 mating pawls 17a, the mating portion 8 of a single crystal 6 is supported at 3 equally spaced points on the circumference. Furthermore, FIG. 3(b) is one example, and the 3 support points can be set arbitrarily. Further, an implementation, which supports at 4 or more points, is also possible.

Accordingly, it is necessary that the open portion of the mating member 17 be wide enough so that at least the minimum diameter portion 8b, which constitutes the minimum diameter of the mating portion 8 of a single crystal 6 (See FIG. 2), is capable of passing therethrough.

Figure 4:
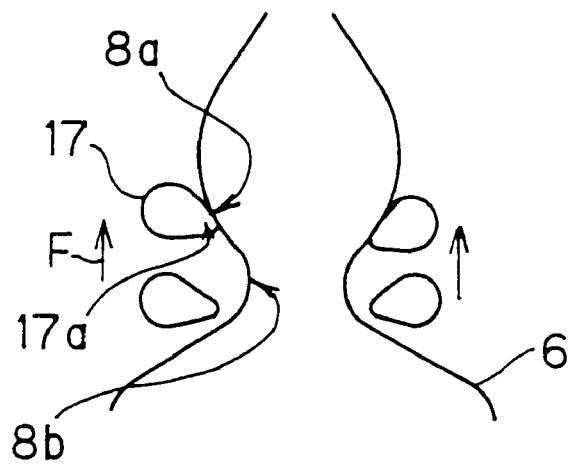
FIG. 4 is a diagram of the arrow A view of FIGS. 3(a) and 3(b)

Further, as for the mating pawls 17a provided on the mating member 17, as shown in FIG. 4, which is a diagram of arrow view A of FIG. 3, when the arm 15 is raised, the mating pawls 17a make contact, and mate with the constricted upper portion 8a, which is located above the minimum diameter portion 8b. The portion from the minimum diameter portion 8b to the constricted upper portion 8a constitutes an upside-down circular cone shape.

Figure 5A:
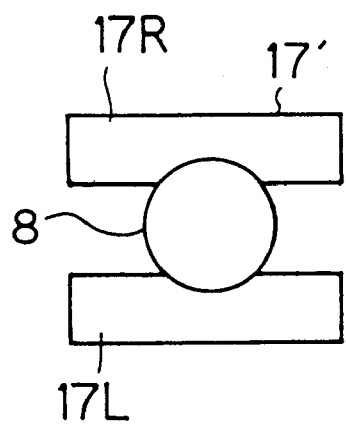
FIGS. 5(a) and 5(b) are diagrams showing examples of kinds of arm mating members.
Figure 5B:
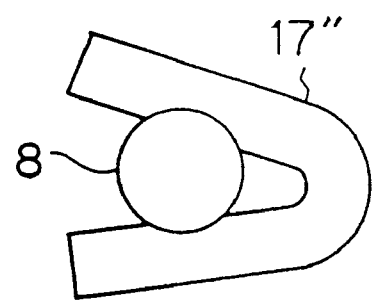

Furthermore, the shape of the mating member 17 is arbitrary, and in place of the circular arc-shaped (horseshoe-shaped) mating member 17 shown in FIGS. 3(a), 3(b), a mating member 17', which constitutes the 2 rod-shaped members shown in FIG. 5(a), can be used, or the V-shaped mating member 17" shown in FIG. 5(b) can be used.

Now, as for the overall shape of the arm 15 as shown in FIG. 9(a), this arm 15 is an integrally-formed arm, and, overall, constitutes a letter U shape. The rod 14a of the arm circular motion actuator 14 is connected to the root portion of the letter U. And then, forked arm members 15R, 15L branch out from this root, and the tips of these forked arm members 15R, 15L are connected to a mating member 17.

In this manner, the arm 15 constitutes forked arm members 15R, 15L, a space is provided between the arm members 15R, 15L, and the wire 10 passes through this space. Accordingly, this is because, if the arm 15 constitutes one arm, for example, the arm 15 would be on the same axis as the wire 10, raising concerns that the wire 10 would interfere with the arm. If there is no concern about the arm 15 and wire 10 interfering with one another, the arm 15 can be constituted of a single arm.

Further, the arm 15 need not be a letter U shape, but rather can also be a shape, by which the portion of the arm 15 from the arm circular motion actuator 14 rod 14a connection location to the circular motion support point 15a is a single arm member 15U, and the portion from the circular motion support point 15a to the mating member 17 connection location is a dual arm member 15R, 15L.

In this case, a hole 15d is provided in the center of the circular motion support point 15a to allow the wire 10 to pass therethrough, and the single arm member 15U is connected in an offset manner relative to this hole 15d.

Next, the processing by this single crystal pulling apparatus when growing a single crystal 6 is described.

First, in accordance with the wire winding portion 13, the wire 10 is wound down, and the seed crystal 12 held in the seed chuck 11 at the tip of the wire 10 is lowered to a position, where it makes contact with the melt 5.

Next, in accordance with the wire winding portion 13, the wire 10 is wound up, and the seed crystal 12 is raised from the surface of the melt 5.

Furthermore, from single crystal growth start to single crystal growth finish, the frame 3, and arm support portion 16 connected thereto, are rotated in a counterclockwise direction B around the crystal center axis 6c in accordance with a revolving mechanism not shown in the figure.

Therefore, the wire 10, arm 15 and single crystal 6 suspended therefrom are rotated in the same direction B from single crystal growth start to single crystal growth finish.

Thus, first, the neck portion 7 is formed. Next, by forming a nodule-shaped portion below this neck portion 7, a neck-shaped mating portion 8, which has a larger diameter, and greater mechanical strength than the neck portion 7, is formed.

This neck-shaped mating portion 8, as shown in FIG. 2 or FIG. 4, comprises a minimum diameter portion 8b, which constitutes the smallest diameter of the constricted portion, and a constricted upper portion 8a, which is located above this minimum diameter portion 8b. In other words, the mating portion 8 constitutes an upside-down circular cone shape, the diameter of which steadily increases the higher above the minimum diameter portion 8b it goes.

Now, the arm circular motion actuator 14 operates to extend the rod 14a in the D1 direction, and the mating member 17 of the arm 15 is shunted to a position separate from the mating portion 8 of the single crystal 6 (See FIG. 1).

Accordingly, as described above, at the point in time when the mating portion 8 is formed on the single crystal 6, the arm circular motion actuator 14 operates in the D2 direction, which retract the rod 14a, the arm 15 moves around the circular motion support point 15a in a circular motion in the direction of arrow E2, undergoing an attitude change to a position which enables mating with the mating portion 8 of the single crystal 6.

FIG. 2 shows the arm attitude at this time.

Next, the arm raising-lowering actuator 20 operates, the arm support portion 16, together with the frame 3, is raised in the direction of arrow J1, and the arm 15 is raised. At this time, the arm 15 is raised in synch with the wire 10 wind-up operation in accordance with the wire winding portion 13.

Therefore, the mating pawl 17a of the arm 15 mating member 17, as indicated by arrow F in FIG. 4, rises in line with the raising of the arm 15, in a state, wherein the mating pawl 17a is securely mated to the constricted upper portion 8a of the mating portion 8.

Accordingly, the arm 15 rises, maintaining as-is an attitude, by which the center of gravity of the single crystal 6 is positioned on the center axis 15c of this arm 15. Consequently, even if the weight of the single crystal 6 acts on the arm 15, only a downward force in the vertical direction (downward tensile force) acts on the arm 15. In other words, since a force in a direction which separates the single crystal 6 from the mating member 17 is not acting on the arm 15, the single crystal 6 can be pulled in a stable manner.

Further, the single crystal 6 can be pulled in a state, wherein the mating portion 8 of the single crystal 6 is securely mated in accordance with the mating pawls 17a of the arm 15 mating member 17. Therefore, the single crystal 6 cannot easily drop during single crystal 6 pulling.

In particular, as shown in FIG. 3(a), when the mating portion 8 of the single crystal 6 is diametrically supported at 2 points in accordance with 2 mating pawls 17a of the mating member 17, even if there is a shift relative to the optimum mating position (a state, wherein the center of gravity of the single crystal 6 is positioned on the center axis 15c of the arm 15) at mating, an effect is achieved, by which the single crystal 6 is oscillated, having the axis that passes through the above-mentioned 2 mating points as a center of oscillation, thus correcting the shift thereof.

Further, as shown in FIG. 3(b), when the mating portion 8 of the single crystal 6 is supported at 3 points in accordance with 3 mating pawls 17a of the mating member 17, an effect is achieved, by which the single crystal 6 is securely mated in accordance with the mating member 17, and the single crystal 6 can be pulled with the attitude of the single crystal 6 stabilized in a fixed position as-is.

As described above, the arm 15 rises, maintaining as-is an attitude, by which the center of gravity of the single crystal 6 is positioned on the center axis 15c of this arm 15. Consequently, even if the weight of the single crystal 6 acts on the arm 15, only a downward force in the vertical direction (downward tensile force) acts on the arm 15. In other words, an angular moment around the circular motion support point 15a (an angular moment in a direction that separates the single crystal 6 from the mating member 17) does not act on the arm 15. Therefore, it is not necessary to operate the arm circular motion actuator 14 to cancel the angular moment thereof, and cause an angular moment for maintaining a mating state to act on the arm. Accordingly, when the arm 15 is raised, the operation of the actuator 14 can be turned off.

However, in this embodiment, since the single crystal 6 oscillates when the arm 15 is raised, the actuator 14 is operated, and the attitude of the arm 15 is controlled so as to suppress the oscillation thereof. In this case, the force acting on the arm 15 is infinitesimally small.

In this manner, since the single crystal 6 is pulled in accordance with the mating member 17 of the arm 15 mating with the greater mechanical strength neck-shaped mating portion 8, the single crystal 6 can be grown without causing damage to the single crystal 6. Moreover, since it is not necessary to cause a large bending moment to act on the arm 15 while the arm is being raised, the arm can be made smaller, lighter weight, and simple in structure.

Furthermore, following the formation of the above-mentioned neck-shaped mating portion 8, a shoulder is made, and a fixed diameter portion 9 as the straight waist portion is formed. In due time, the tail portion is formed, and the single crystal 6 pulling process is complete (single crystal growth is complete).

Furthermore, it is desirable that, at the least, the portion of the mating member 17 that makes contact with the single crystal 6 be constituted of a material, which will not affect the quality of this single crystal 6.

As the material of the mating member 17, a material such as a heavy metal, which will contaminate the silicon material of the single crystal 6 when the mating member 17 comes in contact with the single crystal 6, is not appropriate. A material such as stainless steel, which will not contaminate the silicon material of the single crystal 6 when the mating member 17 comes in contact with the single crystal 6, is desirable.

In this case, a material (stainless steel), which does not adversely affect the quality of the single crystal 6 can be used either partially in just the mating pawls 17a of the mating member 17, or can be used for the entire mating member 17.

Now, in the above-described embodiment, the arm 15 is integrally formed, but a middle-bending structure can also be used for the arm 15.

Figure 6:
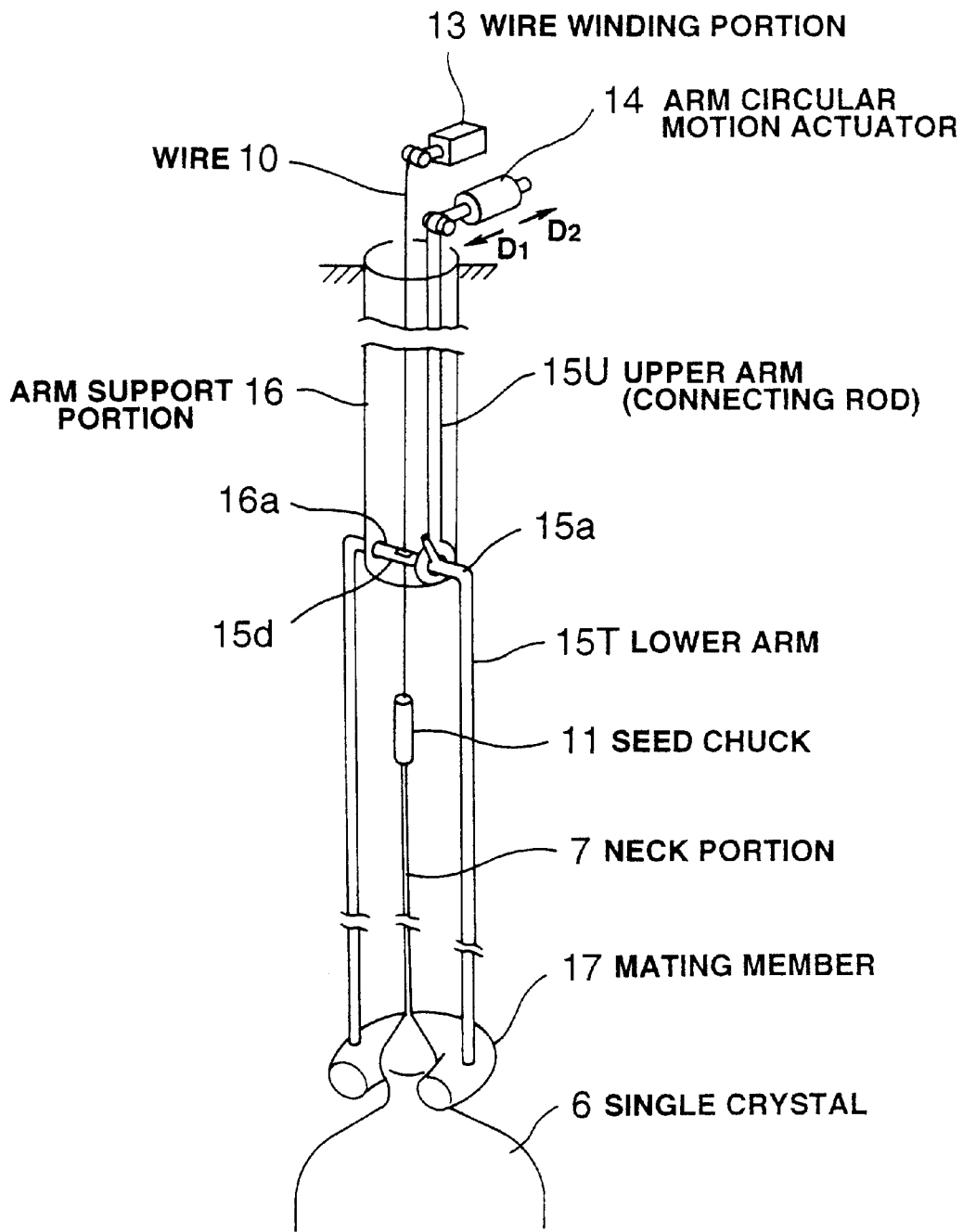
FIG. 6 is a diagram showing the partial constitution of a second embodiment of a single crystal pulling apparatus.
Figure 7A:
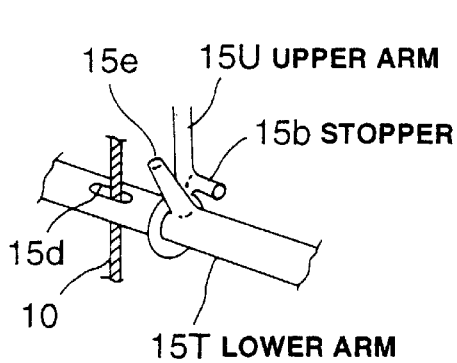
FIGS. 7(a) and 7(b) are an enlarged oblique view, and an enlarged side view used to illustrate the structure of the respective middle-bending portions of arms.
Figure 7B:
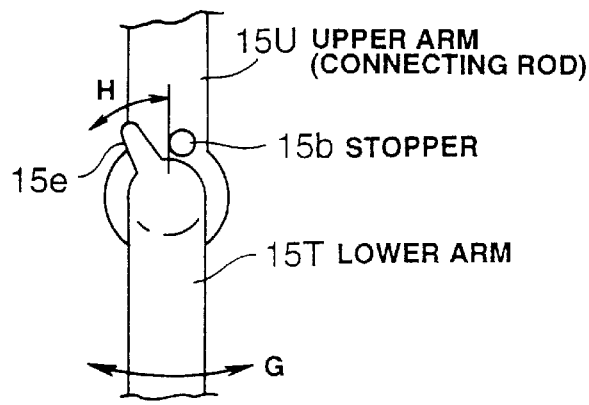
Figure 8:
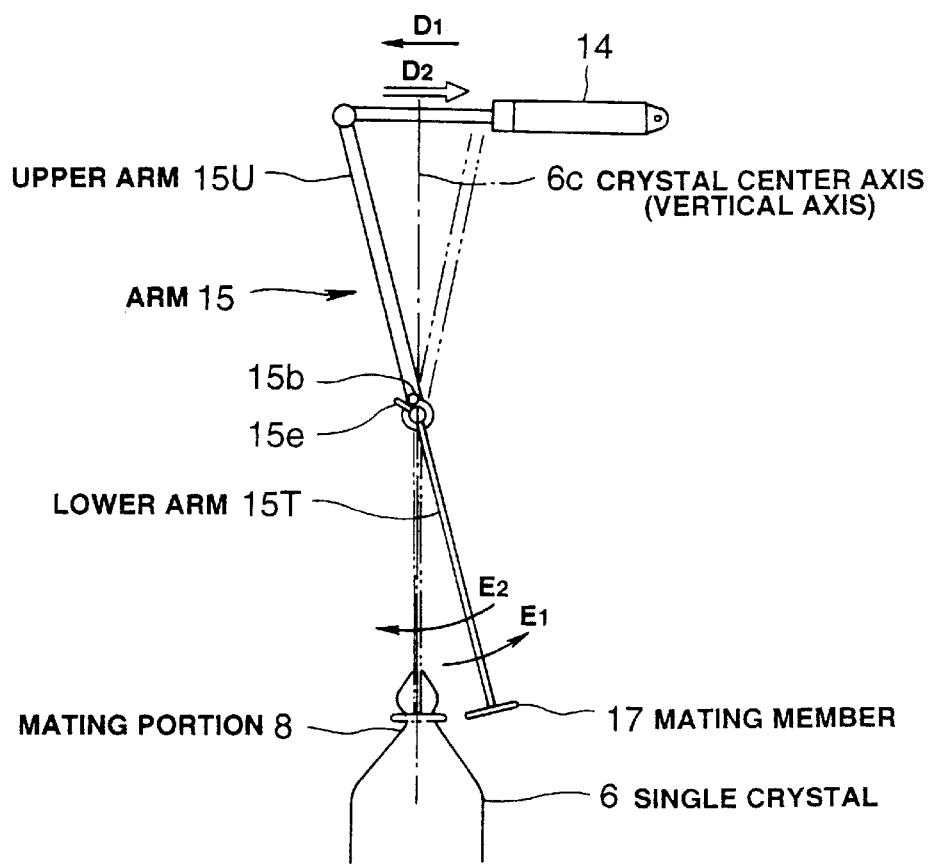
FIG. 8 is a diagram illustrating a state, wherein a middle-bending structure arm undergoes an attitude change.

FIG. 6–FIG. 8 are diagrams illustrating a second embodiment, which uses an arm of a middle-bending structure as the arm for pulling a single crystal.

FIG. 6 is an oblique view showing the constitution of an arm 15 of this kind of middle-bending structure. For the sake of brevity, descriptions of constituents that are the same, and which have the same reference numerals, as those in FIG. 1 have been omitted. This arm 15 is the same shape as the integrally-formed arm 15 shown in FIG. 9(b). The difference is that it is constituted so that the middle-bending is realized at the circular motion support point 15a.

As shown in FIG. 6, this middle-bending structure arm 15 comprises 2 arm members 15U, 15T, and the upper arm member 15U is connected to the arm circular motion actuator 14. The lower arm member 15T comprises 2 arm members 15R, 15L, and these 2 arm members 15R, 15L are linked to the upper arm 15U, which is the connecting rod, in a free-swinging manner, having the circular motion support point shaft 15a as the center of circular motion. In this case, similar to FIG. 9(b), a hole 15d for allowing the wire 10 to pass through is provided in the center of the circular motion support point shaft 15a, and the upper arm member 15U is linked in an offset manner relative to this hole 15d (See FIG. 7(a)).

Therefore, the lower arm member 15T is suspended in a free-swinging manner relative to the upper arm member 15U, so that, in a state, wherein the lower arm member 15T is mated to the mating portion 8 of the single crystal 6, the lower arm member 15T is capable of maintaining a vertical attitude via self-weight.

However, there is provided a stopper 15b, which regulates the movement of the lower arm member 15T relative to the upper arm member 15U so that, when the arm 15 undergoes an attitude change in the direction of arrow E1 of FIG. 8, the force applied from the actuator 14 to the upper arm member 15U acts on the lower arm member 15T. That is, as shown in FIG. 7(b), in a state, wherein the arm 15 is positioned in a vertical attitude, the lower arm member 15T is capable of swinging in the direction of arrow G, but the swinging range thereof is limited to the range up until a protruding portion 15e provided on this lower arm member 15T contacts the stopper 15b of the upper arm member 15U (This range is indicated by H.).

The state, wherein this arm 15 undergoes an attitude change, is shown in FIG. 8.

When the mating of the mating portion 8 of the single crystal 6 is to be released, the arm circular motion actuator 14 moves in the direction of D1, extending the rod 14a.

By so doing, the force applied to the upper arm member 15U by the actuator 14 is transmitted to the lower arm member 15T via the upper arm member 15U stopper 15b and lower arm member 15T protruding portion 15e, the lower arm member 15T undergoes an attitude change in the direction of arrow E1, and the arm 15 mating member 17 is shunted to a position separate from the mating portion 8 of the single crystal 6 (Refer to the solid lines in FIG. 8).

Accordingly, when the arm 15 mating member 17 is to be mated to the mating portion 8 of the single crystal 6, the arm circular motion actuator 14 moves in the direction of D2, retracting the rod 14a.

By so doing, the upper arm member 15U is subjected to an attitude change in accordance with the force applied by the actuator 14, and since the protruding portion 15e of the lower arm member 15T is no longer controlled by the stopper 15b of the upper arm member 15U, the lower arm member 15T moves in a circular manner in the direction of E2 in accordance with self-weight, undergoing an attitude change to a position where the mating member 17 can mate with the mating portion 8 of the single crystal 6.

The attitude of the arm at this time constitutes an attitude, which, as shown in FIG. 2, is similar to that of an integrally-formed arm 15, and the arm rises, maintaining as-is an attitude, by which the center of gravity of the single crystal 6 is positioned on the center axis 15c of this arm 15. Consequently, even if the weight of the single crystal 6 acts on the arm 15, only downward force in the vertical direction (downward tensile force) is applied to the arm 15. In other words, since a force in a direction which separates the single crystal 6 from the mating member 17 is not acting on the arm 15, the single crystal 6 can be pulled in a stable manner.

Moreover, with this middle-bending structure arm 15, since the lower arm member 15T is suspended from the upper arm member 15U in a free-swinging manner, the lower arm member 15T is capable of maintaining a vertical attitude by absorbing the oscillation of the single crystal 6 using self-weight alone, without the need of the controlling force of the actuator 14.

Furthermore, this embodiment assumed a case, wherein the arm 15 is mated to the single crystal 6 in accordance with the operation of a direct-acting actuator 14, but an embodiment can also be implemented so that the arm 15 is made to mate with the single crystal 6 in accordance with the self-weight of the arm 15 alone, without using an actuator to make the arm 15 move in a circular motion.

For example, it is possible to imagine an implementation, which provides a locking mechanism, which locks the arm 15 in a state which is diagonal to the vertical attitude when the integrally-formed arm 15 shown in FIG. 1 is subjected to an attitude change, and by releasing the lock of the locking mechanism, the arm 15 is made to undergo an attitude change around the circular support point 15a in the mating direction E2 in accordance with self-weight alone.

However, as a mating member, when using a mating member 17', which constitutes 2 separate and opposing members 17R, 17L, which mate with the mating portion 8 as shown in FIG. 5(a), due to insufficient strength and other reasons, there is the concern that the space between these 2 opposing members 17R, 17L will widen when a single crystal 6 is pulled.

Figures 10A, 10B:
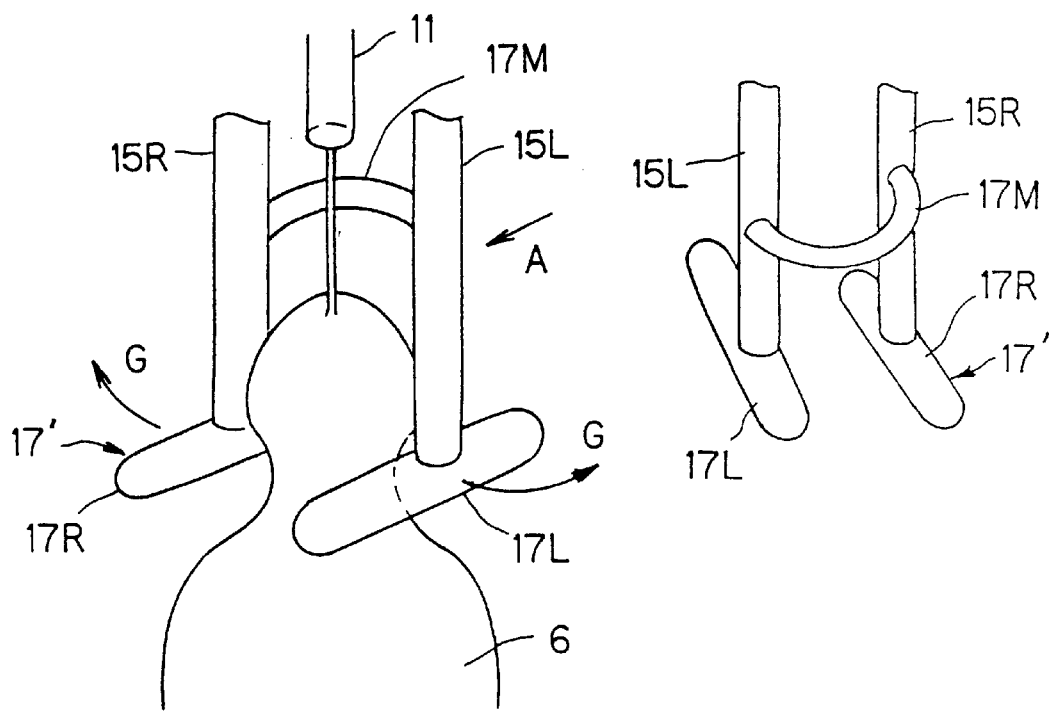
FIGS. 10(a) and 10(b) are diagrams showing examples of structures for preventing the opening of mating members.

Accordingly, as shown in FIG. 10 (FIG. 10(b) is a diagram of arrow view A of FIG. 10(a)), to prevent these 2 opposing members 17R, 17L from opening, a linking member 17M, which links these 2 opposing members 17R, 17L, can be provided. In FIG. 10, the arms 15R, 15L are linked in the vicinity of the mating member 17' in accordance with a linking member 17M. By so doing, the opening of the opposing members 17R, 17L of the mating member 17' is prevented when pulling a single crystal 6, and the single crystal 6 is prevented from separating from the mating member 17'.

Further, each of these members 17R, 17L, 17M can be constituted in an integrated manner. The mating member 17 shown in FIG. 3(a) is constituted by integrating the opposing members 17R, 17L with the member 17M, which links these opposing members 17R, 17L together, preventing the opposing members 17R, 17L from opening, and preventing the single crystal 6 from separating from the mating member 17.

Further, as shown in FIG. 9(a), the root portion of the arm 15, which is distant from the mating member 17, can also serve as a linking member 17M. In place of the mating member 17 in FIG. 9(a), even when using a mating member 17', the opposing members 17R, 17L of which constitute separate bodies, as shown in FIG. 5(a), adding a linking member 17M to the root portion of the arm 15 will increase the strength, and prevent the single crystal 6 from separating from the mating member 17'.

Furthermore, this embodiment assumes a case in which the arm 15 is actively mated to a single crystal 6, and the single crystal 6 is pulled primarily by the arm 15 rather than the wire 10, but as the present invention, the arm 15 can be used to prevent a single crystal 6 from dropping when the single crystal 6 is being pulled primarily by the wire 10.

That is, a single crystal 6 is suspended by a wire 10, and is pulled in accordance with winding up this wire 10. During this pulling, even if the neck portion 7 of the single crystal 6 is damaged, for example, because the mating member 17 of the arm 15 is positioned at a location, which enables mating with a mating portion 8, which is lower than this neck portion 7, the portion below the neck portion will not drop, and pulling can continue with the mating member 17 of the arm 15 securely mated as-is to the mating portion 8 of the single crystal 6.

What is claimed is:

1. A single crystal pulling apparatus, which is used when growing a single crystal in accordance with bringing a seed crystal in contact with a melt, and then pulling said seed crystal from said melt, wherein:

a mating portion is formed on said single crystal said apparatus comprising a single one-piece arm, the arm having a center axis positioned on a same axis as a vertical center axis of the single crystal when said single crystal is pulled, the arm having a mating member integrally formed with the arm at the end of the arm, said mating member having a shape, which mates to said mating portion and which does not allow said single crystal to drop when said single crystal is pulled, the arm being provided with a circular motion support point at a location in a longitudinal direction of said arm, by which said arm is made to move in a circular manner until the mating member of the arm is in a position that enables mating with the mating portion of said single crystal; and an attitude of said arm is changed to the position at which the mating member of said arm is able to mate with the mating portion of said single crystal, and thereafter, the arm is raised in a state in which said mating member of the arm is made to mate with the mating portion of said single crystal.

2. The single crystal pulling apparatus according to claim 1, wherein the attitude of said arm is changed to the position at which the mating member of said arm is able to mate with the mating portion of said single crystal, by actuating an actuator connected to said arm.

3. The single crystal pulling apparatus according to claim 2, wherein said arm comprises upper and lower members, the upper arm member being connected to said actuator, the lower arm member having said mating member, and being suspended in a free-swinging manner relative to said upper arm member so as to be capable of maintaining a vertical attitude in accordance with self-weight in a state in which the lower arm member undergoes an attitude change to a position which enables mating with the mating portion of said single crystal.

4. The single crystal pulling apparatus according to claim 1, wherein said arm is an integrally-formed arm.

5. The single crystal pulling apparatus according to claim 1, wherein, the arm is provided with the circular motion support point at the location in the longitudinal direction of said arm, by which said arm is made to move in the circular manner until the mating member of the arm is in the position that enables mating with the mating portion of said single crystal, the circular motion support point being raised in synch with the pulling operation of said single crystal.

6. The single crystal pulling apparatus according to claim 1, wherein the attitude of said arm is changed to the position at which the mating member of said arm is able to mate with the mating portion of said single crystal, by a gravitational force acting on said arm.

7. The single crystal pulling apparatus according to claim 1, wherein said mating member constitutes a shape, which mates by diametrically supporting the mating portion of said single crystal at two points.

8. The single crystal pulling apparatus according to claim 1, wherein said mating member constitutes a shape, which mates by supporting the mating portion of said single crystal at three or more points.

9. The single crystal pulling apparatus according to claim 1, wherein said mating member mates with the mating portion of said single crystal by two opposing members, and wherein the mating member is provided a member which links these two opposing members so that a space between these two opposing members will not open when pulling said single crystal.

10. A single crystal droppage preventing device, which prevents droppage of a single crystal when growing the single crystal in accordance with bring a seed crystal in contact with a melt, and then pulling said seed crystal from said melt, wherein:

a mating portion is formed on said single crystal;

said device consisting essentially of a single one-piece arm, said arm having a center axis positioned on a same axis as a vertical center axis of the single crystal when said single crystal is pulled, the arm having a mating member integrally formed with the arm at an end of the arm, said mating member having a shape, which mates to said mating portion and which does not allow said single crystal to drop when said single crystal is pulled, the arm being provided with a circular motion support at a location in a longitudinal direction of said arm, by which said arm is made to move in a circular manner until the mating member of the arm is in a position that enables mating with the mating portion of said single crystal; and an attitude of said arm is changed to the position at which the mating member of said arm is able to mate with the mating portion of said single crystal, and thereafter, the arm is raised in a state in which said mating member of the arm is made to mate with the mating portion of said single crystal.

* * * * *